United States Patent
Yu

(10) Patent No.: US 6,642,088 B1
(45) Date of Patent: Nov. 4, 2003

(54) SILICON-CONTROLLED RECTIFIER STRUCTURES ON SILICON-ON INSULATOR WITH SHALLOW TRENCH ISOLATION

(75) Inventor: Ta Lee Yu, Hsinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/120,008

(22) Filed: Apr. 10, 2002

(51) Int. Cl.[7] .................. H01L 21/84; H01L 21/20
(52) U.S. Cl. ........................... 438/155; 438/480
(58) Field of Search ..................... 438/480, 155

(56) References Cited

U.S. PATENT DOCUMENTS

| | | | |
|---|---|---|---|
| 5,012,317 A | 4/1991 | Rountre | 357/38 |
| 5,530,612 A | 6/1996 | Maloney | 361/56 |
| 5,629,544 A | 5/1997 | Voldman et al. | 257/355 |
| 5,949,634 A | 9/1999 | Yu | 361/111 |
| 6,074,899 A * | 6/2000 | Voldman | 438/155 |
| 6,242,763 B1 | 6/2001 | Chen et al. | 257/107 |
| 6,521,952 B1 * | 2/2003 | Ker et al. | 257/360 |
| 6,573,566 B2 * | 6/2003 | Ker et al. | 257/355 |
| 2003/0007301 A1 * | 1/2003 | Ker et al. | 361/111 |

OTHER PUBLICATIONS

US 5,945,148, 8/1999, Yu (withdrawn)
Stanley Wolf Silicon Processing for the VSLI ERA vol. 2 Lattice Press 1990 pp. 103,109,144–145.*

* cited by examiner

*Primary Examiner*—Carl Whitehead, Jr.
*Assistant Examiner*—David S Blum
(74) *Attorney, Agent, or Firm*—George O. Saile; Stephen B. Ackerman; Douglas R. Schnabel

(57) ABSTRACT

A method to form a SCR device in the manufacture of an integrated circuit device is achieved. The method comprises providing a SOI substrate comprising a silicon layer overlying a buried oxide layer. The silicon layer further comprises a first well of a first type and a second well of a second type. A first heavily doped region of the first type is formed in the second well to form an anode terminal. A second heavily doped region of the second type is formed in the first well to form a cathode terminal and to complete the SCR device. A gate isolation method is described. A salicide method is described. LVT-SCR methods, including a floating-well, LVT-SCR method, are described.

24 Claims, 11 Drawing Sheets

US 6,642,088 B1

SILICON-CONTROLLED RECTIFIER STRUCTURES ON SILICON-ON INSULATOR WITH SHALLOW TRENCH ISOLATION

BACKGROUND OF THE INVENTION (1) Field of the Invention

The invention relates to silicon-on-insulator (SOI) devices and, more particularly, to a method to form a silicon-controlled rectifier (SCR) SOI device having improved ESD performance.

(2) Description of the Prior Art

At present, the vast majority of integrated circuit products are formed on bulk semiconductor wafers. However. silicon-on-insulator (SOI) wafer-based products are under development as a majority technology for the future. SOI offers the advantages of improved short channel performance, improved isolation, and reduced power supply capability. However, ESD protection of SOI devices remains a significant challenge to manufacturers. One particular Category of ESD devices is the silicon-controlled rectifier (SCR). The SCR is commonly used for ESD protection in bulk semiconductor technology. The present invention relates to SCR development in SOI technology.

Referring now to FIG. 1, an example of a prior art SCR device in a bulk semiconductor process is shown. The substrate 2 herein comprises p-type silicon. An n-well region 4 is formed in the substrate 2. Shallow trench isolation regions (STI) 6 are formed in the substrate 2 to define areas for active devices, sometimes called the OD area. Heavily doped regions 8, 10, 12, and 14 are formed in the n-well 4 and p-substrate 2. More particularly, a first n+region 8 and a first p+ region 10 are formed in the n-well 4, and a second n+ region 12 and a p+ region 14 are formed in the substrate 2. The first n+ and p+ regions 8 and 10 are coupled together to form an ANODE. The second n+ and p+ regions 12 and 14 coupled together to form the CATHODE. This structure forms two bipolar devices, a npn transistor and a pnp transistor, which will conduct current from the anode to the cathode during an ESD event.

Referring now to FIG. 2, a second prior art, bulk semiconductor device is shown. Here, a low voltage trigger, SCR, or LVT-SCR, is shown. The LVT-SCR comprises the same n-well 4 and p-substrate 2 combination used by the SCR of FIG. 1. The first n+ region 8, first p+ region 10, second n+ region 18, and second p+ region 20 are placed in the n-well 4 and the p-substrate 2 as in the SCR. However, an additional n+ region 16 is added at the interface of the n-well 4 and the p-substrate 2. Further, a MOS gate 22 is added between the second n+ 18 and the third n+ 16. This gate is coupled to the cathode. This LVT-SCR configuration adds an NMOS device to the npn and pnp devices of the SCR. The NMOS device reduces the triggering voltage of the SCR device and thereby improves the ESD protection capability.

The SCR and LVT-SCR devices of the prior present several difficulties in integration with a SOI process. In an SOI process, the devices must be formed in a relatively thin silicon layer overlying a buried insulator layer. This buried insulator layer, in turn, overlies the bulk substrate. The presence of the buried insulator layer improves MOS transistor performance, especially for very short channel devices, and reduces substrate coupling issues by providing excellent device-to-device isolation. Typically, the STI regions are formed down to the buried insulator layer such that each active area is completely isolated from other active areas.

However, these characteristics cause several problems for SCR devices formed in an SOI process having STI isolation.

First, the presence of the STI regions within the SCR and LVT-SCR devices reduces the lateral heat transfer property during an ESD event. Consequently, the devices fail at a lower energy dissipation level. Second, the STI pull-down impacts both low-current and high-current characteristics and influences the diode leakage characteristics. Third, the thickness of the silicon layer overlying the buried insulator can restrict the formation of the SCR device. If the silicon layer is relatively thin, then the heavily doped (n+ and p+) regions will extend down to the buried insulator layer. In this case, the traditional SCR and LVT-SCR design will not work because the bipolar devices will not function.

Several prior art inventions relate to the ESD performance of SOI devices. U.S. Pat. No. 6,242,763 to Chen et al teaches a silicon-controlled rectifier (SCR) device for a SOI process. The SCR adds an N+/P+ zener diode to the prior SCR to reduce the trigger voltage. U.S. Pat. No. 5,012,317 to Rountre shows a conventional SCR. The STI is found to degrade the SCR-ESD protection by reducing gains of parasitic bipolar devices and by reducing lateral heat transfer. U.S. Pat. No. 5,530,612 to Maloney shows an ESD circuit using biased and terminated PNP transistor chains. U.S. Pat. No. 5,629,544 to Voldman et al reveals a diode device for ESD having silicide film and trench isolation. U.S. Pat. No. 5,949,634 to Yu shows an ESD circuit triggered by a MOS transistor. U.S. Pat. No. 5,945,714 to Yu discloses a related ESD design.

SUMMARY OF THE INVENTION

A principal object of the present invention is to provide an effective and very manufacturable method of forming a SCR ESD device on a SOI substrate.

A further object of the present invention is to provide a method to form a SCR device on SOI where the effect of the STI region is reduced.

Another further object of the present invention is to reduce STI effects by using a gate layer between heavily doped regions instead of a STI.

Another further object of the present invention is to provide a method to form self-aligned silicide in the SCR device on SOI.

Another further object of the present invention is to provide a method to form a LVT-SCR device on SOI.

Another further object of the present invention is to provide a method to form a floating-well, LVT-SCR device on SOI having improved performance.

In accordance with the objects of this invention, a method to form a SCR device in the manufacture of an integrated circuit device is achieved. The method comprises providing a SOI substrate comprising a silicon layer overlying a buried oxide layer. The silicon layer further comprises a first well of a first type and a second well of a second type. A first heavily doped region of the first type is formed in the second well to form an anode terminal. A second heavily doped region of the second type is formed in the first well to form a cathode terminal and to complete the SCR device.

Also in accordance with the objects of this invention, a method to form a LVT-SCR device in the manufacture of an integrated circuit device is achieved. The method comprises providing a SOI substrate comprising a silicon layer overlying a buried oxide layer. The silicon layer further comprises a first well of a first type and a second well of a second type. A first heavily doped region of the first type is formed in the second well to form an anode terminal. A second heavily doped region of the second type is formed in the first well. A third heavily doped region of the first type is formed in the first well. A fourth heavily doped region of the second type is formed partly in the first well and partly in the second well. A gate is formed overlying the silicon layer between the second and fourth heavily doped regions. The gate comprises a conductive layer overlying the silicon layer with an insulator therebetween. The second and third heavily doped regions and the gate are coupled together to form a cathode terminal.

Also in accordance with the objects of this invention, a method to form a LVT-SCR device in the manufacture of an integrated circuit device is achieved. The method comprises providing a SOI substrate comprising a silicon layer overlying a buried oxide layer. The silicon layer further comprises a first well of a first type and a second well of a second type. A first heavily doped region of the first type is formed in the second well. A second heavily doped region of the second type is formed in the first well. A third heavily doped region of the first type is formed in the first well. A fourth heavily doped region of the second type is formed in the first well. A gate is formed overlying the silicon layer between the second and fourth heavily doped regions. The gate comprises a conductive layer overlying the silicon layer with an insulator therebetween. The first and fourth heavily doped regions are coupled together to form an anode terminal. The second and third heavily doped regions and the gate are coupled together to form a cathode terminal.

Also in accordance with the objects of this invention, a SCR device on a SOI substrate is achieved. The SCR device comprises, first, a SOI substrate comprising a silicon layer overlying a buried oxide layer. The silicon layer further comprises a first well of a first type and a second well of a second type. An anode terminal comprises a first heavily doped region of the first type in the second well. A cathode terminal comprises a second heavily doped region of the second type in the first well and a third heavily doped region of the first type in the first well. A gate is used overlying the silicon layer between the second and third heavily doped regions. The gate comprises a conductive layer overlying the silicon layer with an insulating layer therebetween.

Also in accordance with the objects of this invention, a LVT-SCR device on a SOI substrate is achieved. The LVT-SCR device comprises a SOI substrate comprising a silicon layer overlying a buried oxide layer. The silicon layer further comprises a first well of a first type and a second well of a second type. A first heavily doped region of the first type is in the second well. A second heavily doped region of the second type is in the first well. A third heavily doped region of the first type is in the first well. A fourth heavily doped region of the second type is partly in the first well and partly in the second well. A gate overlies the silicon layer between the second and fourth heavily doped regions. The gate comprises a conductive layer overlying the silicon layer with an insulator therebetween. The second and third heavily doped regions and the gate are coupled together to form a cathode terminal. The first heavily doped region-forms an anode terminal.

Also in accordance with the objects of this invention, a LVT-SCR device on a SOI substrate is achieved. The LVT-SCR device comprises a SOI substrate comprising a silicon layer overlying a buried oxide layer. The silicon layer further comprises a first well of a first type and a second well of a second type. A first heavily doped region of the first type is in the second well. A second heavily doped region of the second type is in the first well. A third heavily doped region of the first type is in the first well. A fourth heavily doped region of the second type is in the first well. A gate overlies the silicon layer between the second and fourth heavily doped regions. The gate comprises a conductive layer overlying the silicon layer with an insulator therebetween. The first and fourth heavily doped regions are coupled together to form an anode terminal. The second and third heavily doped regions and the gate are coupled together to form a cathode terminal.

BRIEF DESCRIPTION OF THE DRAWINGS

In the accompanying drawings forming a material part of this description, there is shown.

DESCRIPTION OF THE PREFERRED EMBODIMENTS

The preferred embodiments of the present invention disclose a method to form a SCR device on SOI with shallow trench isolation and having improved ESD performance. Within the SCR device, STI is eliminated or replaced by a gate layer. A self-aligned silicide process for the SCR device is disclosed. The SCR method is extended to LVT-SCR devices as well. It should be clear to those experienced in the art that the present invention can be applied and extended without deviating from the scope of the present invention.

Figure 3:
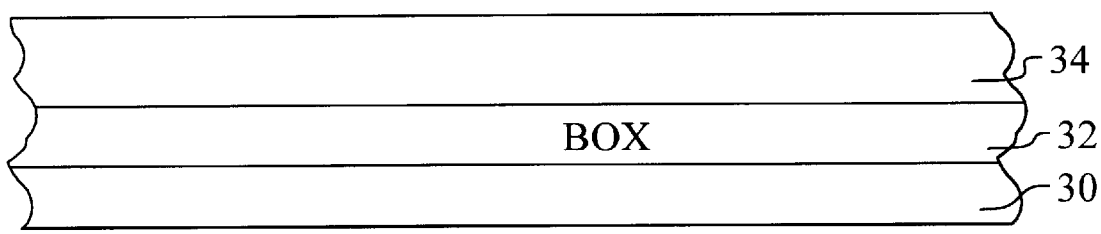
FIGS. 3 through 6 illustrate a first preferred embodiment method of forming a SCR device of the present invention.

Referring now to FIG. 3, the preferred starting point of the method the present invention is shown. The present invention applies to any SOI system. In this case, the SOI system, shown in cross-sectional representation, comprises a buried oxide layer 32 overlying a substrate 30. For example, the substrate 30 may comprise silicon. The buried oxide layer 32 preferably comprises a thick silicon oxide layer that is either grown or deposited overlying the silicon substrate 30. Other oxide materials could be used for the buried oxide layer 32.

A silicon layer 34 is formed overlying the buried oxide layer 32. The silicon layer 34 preferably comprises a monocrystalline layer that is formed using, for example, an epitaxial deposition. The silicon layer 34 may be formed to a range of thickness as will be discussed below. The stack comprising silicon layer 34, buried oxide layer 32, and substrate 30 forms the silicon-on-insulator (SOI) system for this embodiment. Alternatively, the substrate 30 could be absent from the system wherein the substrate would comprise merely a buried oxide layer 30. For simplicity, the substrate 30 will not be depicted in the Figures that follow FIG. 3.

Figure 4:
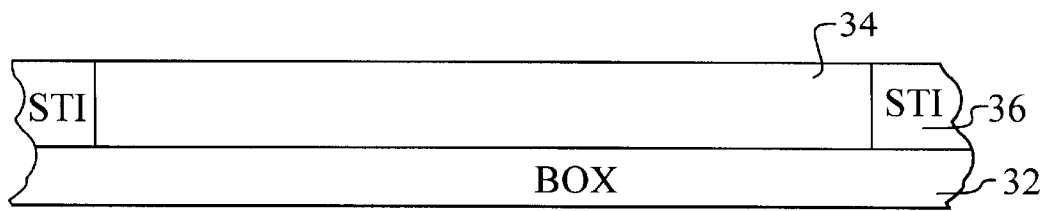

Referring now to FIG. 4, shallow trench isolations (STI) 36 are formed in the silicon layer 60 using methods well known in the art. These STI regions 36 define active area regions of silicon layer 34 where active devices may be subsequently formed. Of particular importance to the present invention is the fact that the STI regions 36 are not formed within the area of the planned SCR device as in the prior art.

Figure 5:
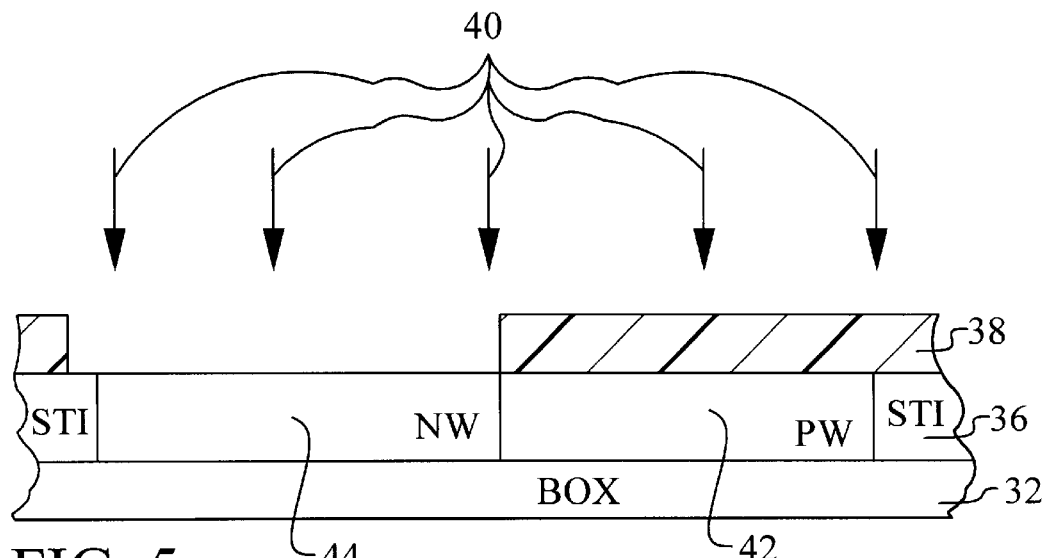

Referring now to FIG. 5, a first well 42 of a first type is formed, and a second well 44 of a second type is formed. In the preferred embodiment, the first well 42 is p-type and is therefore called the p-well. The second well 44 is n-type and, is called the n-well. The first and second wells 42 and 44 may be formed by ion implantation 40 of the silicon layer using a masking layer 38 to cause the implantation to be selective.

Alternatively, either the p-well or the n-well may simply comprise the silicon layer 34 formed with an in situ doping. In this case, only a single ion implantation needs to be performed to counter-dope the silicon layer 34 to the other type. For example, the silicon layer 34 may be formed as a p-type region, and the n-well 44 region is then formed by ion implantation 40 as is well known in the art. Finally, the well regions 42 and 44 may be doped using a diffusion process.

Figure 6:
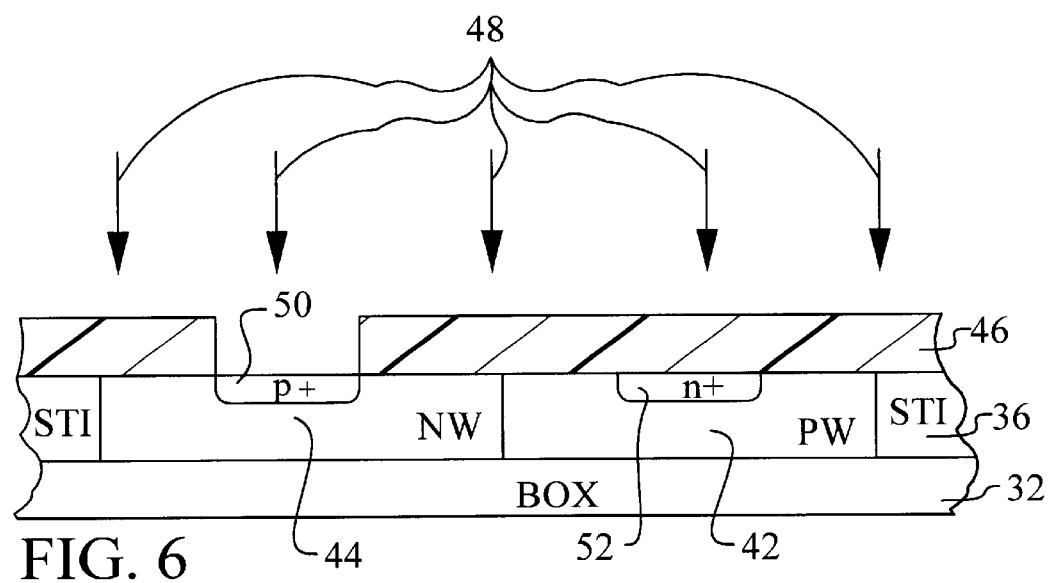

Referring now to FIG. 6, as an important feature of the present invention, heavily doped regions 50 and 52 are formed in the wells 42 and 44. More particularly, a first heavily doped region 50 of the first type is formed in the second well 44. A second heavily doped region 52 is formed in the first well 42. In the preferred embodiment, the first heavily doped region 50 comprises a p+ type region formed in the n-well 44 using an ion implantation 48. A masking layer 46 may be used to cause the implantation 48 to be selective. The second heavily doped region 52 preferably comprises a n+ type region formed in the p-well 42.

Figure 7A:
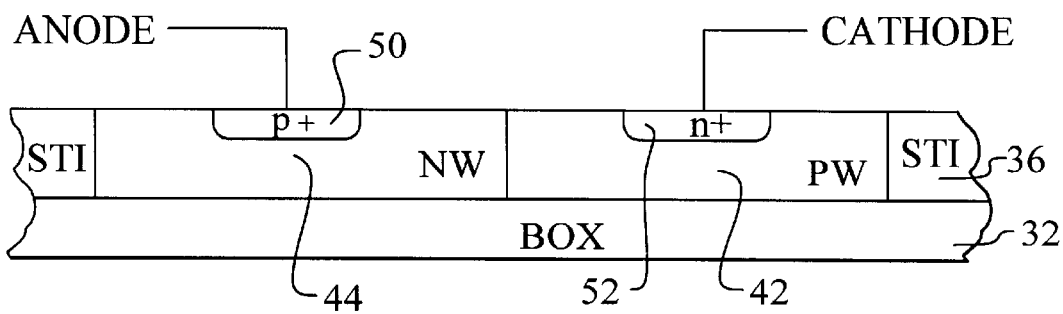
FIGS. 7A–7C illustrate a first preferred embodiment SCR device of the present invention in cross-section, in top layout view, and in model form where the heavily doped regions partially deplete the wells.
Figure 7B:
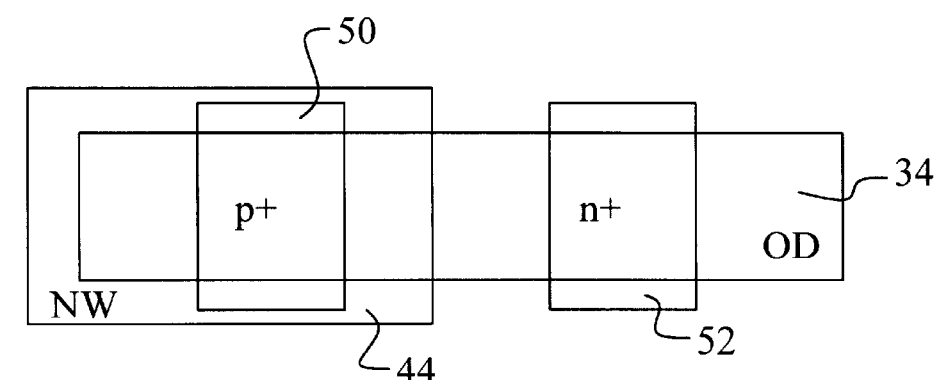
Figure 7C:
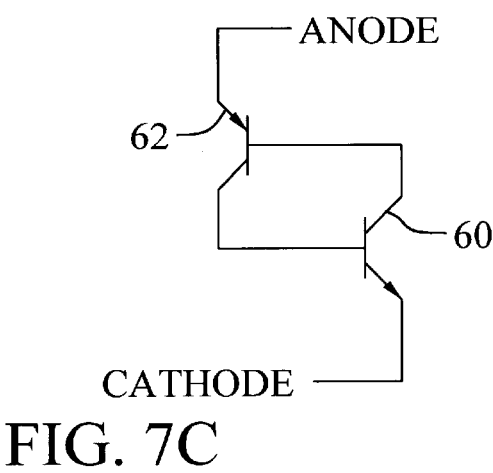

Referring now to FIG. 7, the completed SCR device in SOI is shown. The first heavily doped region 50 forms the anode terminal. The second heavily doped region 52 forms the cathode terminal. Of importance to the present invention is the fact that active area between the STI regions 36 does not contain any other STI regions. Because of this novel approach, the SCR device of the present invention displays improved ESD performance. Referring now to FIG. 7C, a model of the SCR device is shown. The model comprises, first, a pnp transistor 62 defined by the p+ region 50 coupled to the anode, the n-well 44, and the p-well 42. A npn transistor 60 comprises the n+ region 52 coupled to the cathode, the p-well 42, and the n-well 44. By eliminating the STI regions 36 within the SCR device, as seen in the prior art bulk device, the performance of the bipolar devices 60 and 62 is enhanced. This, in turn, improves the ESD performance of the SCR device.

Referring now to FIG. 7B, a top layout view of the SCR device is shown. The active area is defined by the OD mask 34. Areas outside the OD mask 34 become STI regions 36. Assuming that the p-well 42 comprises the in situ doped silicon layer overlying the buried oxide 32, only a n-well mask 44 is used. The n-well mask 44 overlaps the OD mask 34. The p+ mask 50 and n+ mask 52 are used to define the first and second heavily doped regions. The p+ and n+ masks 50 and 52 are defined overlapping the edges of the OD area 34 in this example. This is because the heavily doped regions 50 and 52 only partially deplete the wells 42 and 44.

Referring again to FIG. 7A, the wells 42 and 44 are formed in the silicon layer 34. Because the original silicon layer 34 is formed to a sufficient thickness, the heavily doped regions 50 and 52 do not reach the buried oxide layer 32. This condition is called partial depletion. As a result, the wells 42 and 44 extend under the n+ and p+ regions 52 and 50. Because the wells extend under the n+ and p+, the n+ and p+ masks can be defined to the full width of the active area.

Figure 8A:
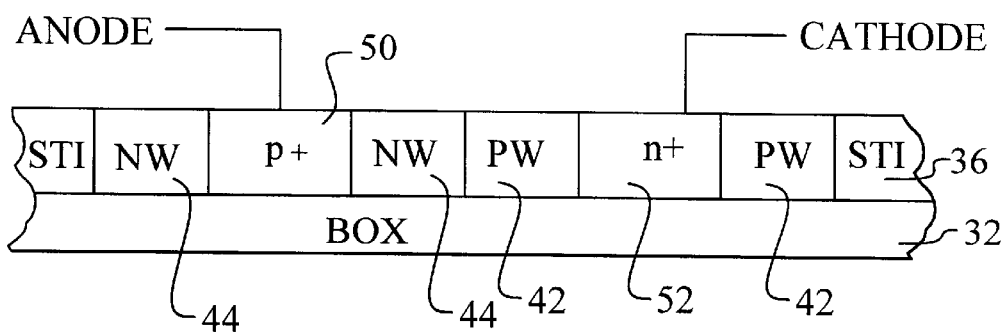
FIGS. 8A–8B illustrate the first preferred embodiment SCR device of the present invention in cross-section and in top layout view where the heavily doped regions fully deplete the wells.
Figure 8B:
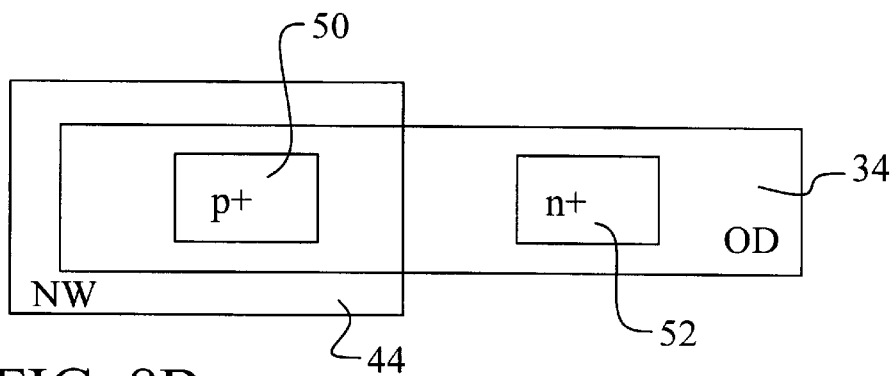

Referring now to FIG. 8A, an alternative condition is depicted. The same SCR device is constructed as in 7A. However, in this case, a relatively thin silicon layer 34 was formed. The heavily doped regions 50 and 52 do extend to the buried oxide layer 32. In this case, the p+ and n+ regions 50 and 52 are said to fully deplete the wells 42 and 44. Because of the fully depleted condition, the wells 42 and 44 do not extend below the heavily doped regions 50 and 52. This effect must be accounted for in the device layout or else the resulting SCR will operate poorly. Referring now to FIG. 8B, the top layout view for the fully depleted SCR is shown. The active area, OD, mask 34 and the n-well mask 44 are formed as in the prior case. However, the p+ mask and the n+ mask 52 are undersized such that wells 42 and 44 can extend around the heavily doped regions 50 and 52.

Figure 1:
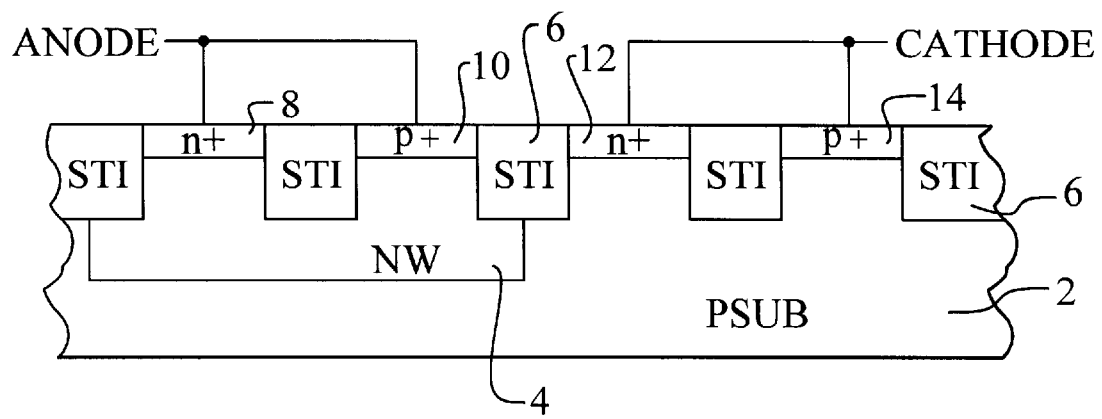
FIG. 1 illustrates a prior art SCR on a bulk semiconductor substrate.
Figure 2:
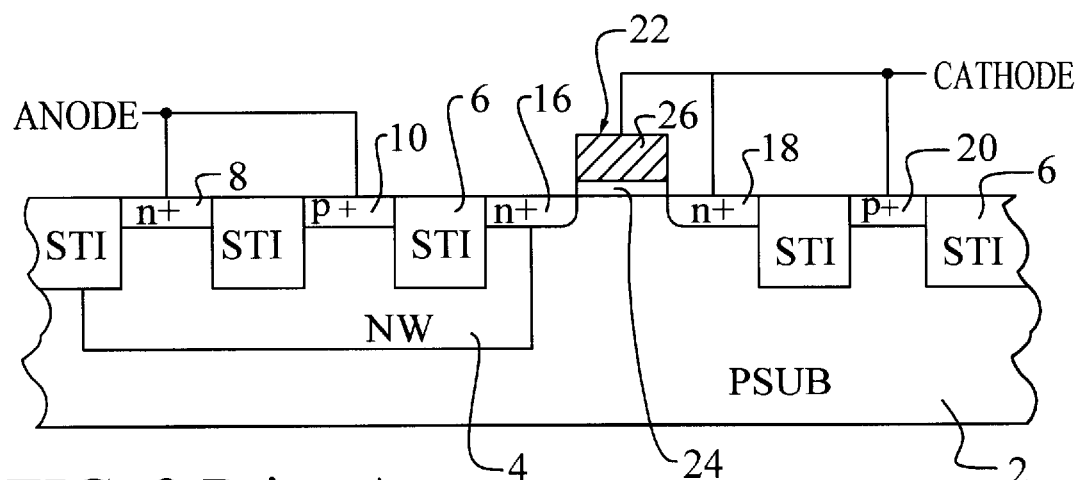
FIG. 2 illustrates a prior art LVT-SCR on a bulk semiconductor substrate.
Figure 9:
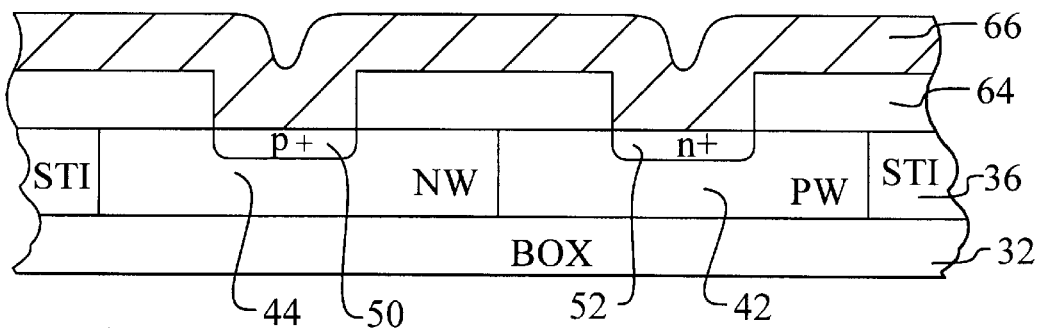
FIGS. 9–10 illustrate a second preferred embodiment method for forming a self-aligned silicide layer on the heavily doped regions of the SCR device.

Referring now to FIG. 9, an important feature of the present invention is shown. The removal of the STI regions 36 from the interior of the SCR device does have an adverse affect if a silicide layer is to be used. A typical self-aligned silicide or salicide, process may use the STI regions for selective formation of the silicide layer. In such a process, a metal layer is deposited, annealed, and then removed. Where the metal layer contacts silicon materials, such a polysilicon or the silicon substrate, a layer of silicide will form. This silicide exhibits a low resistivity and is very useful in reducing gate, source, and drain resistance. However, the silicide layer does not form on oxide materials. Referring again to FIG. 1, the presence of the STI regions 6 in the prior art examples is typically used to create a salicide process whereby a silicide layer may be formed on the heavily doped regions 8, 10, 12, and 14without creating a short circuit.

Referring again to FIG. 9, a novel method of forming silicide on the SCR device of the present invention is shown.

Figure 10:
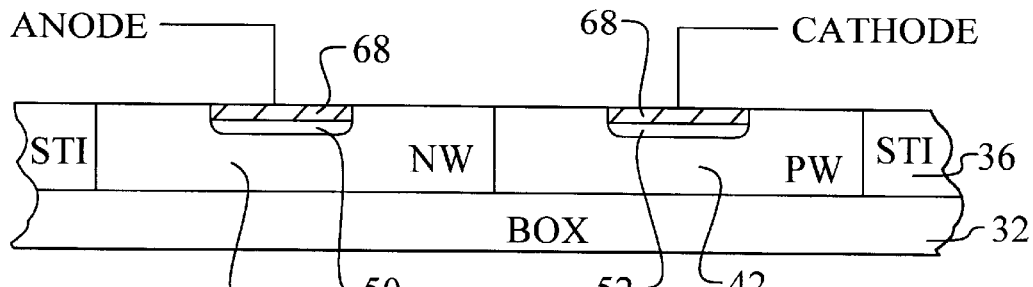

First, a masking layer 64 is formed overlying the SOI substrate following the formation of the heavily doped regions 50 and 52. This masking layer 64 may comprise, for example an oxide layer. The masking layer 64 is then patterned, using, for example, a photolithographic process followed by etching as is known in the art. The masking layer 64 pattern is defined such that the heavily doped regions 50 and 52 are exposed while the wells 42 and 44 are covered. A metal layer 66 is then deposited overlying the masking layer 64 and the exposed heavily doped regions 50 and 52. The metal layer 66 preferably comprises a metal such as cobalt or titanium that will form a low resistivity silicide by reaction with silicon. An annealing process is then performed to catalyze the silicide reaction. Referring now to FIG. 10, the metal layer 66 and the masking layer 64 are removed to reveal the silicide layer 68 formed on the heavily doped regions 50 and 52.

Figure 11A:
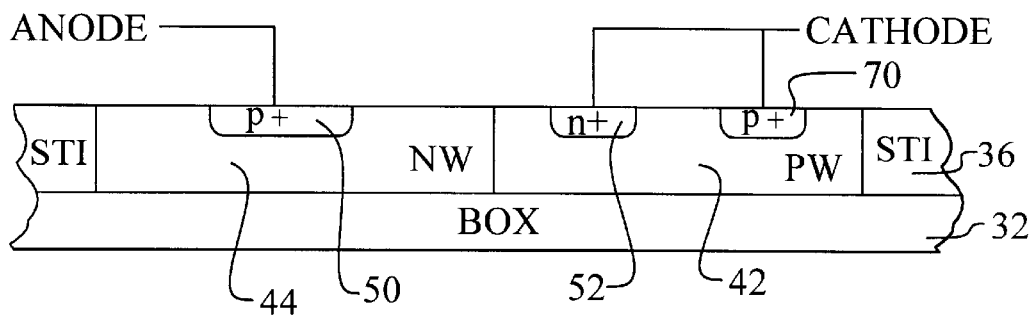
FIGS. 11A–11B illustrate a second preferred embodiment SCR device of the present invention in cross-section and in model form where a third heavily doped region is added to couple the first well to the cathode.

Referring now to FIG. 11A a second preferred embodiment of the present invention SCR is shown. In this embodiment, a third heavily doped region 70 of the first type is formed in the first well 42. More preferably, a p+ type region 70 is formed in the p-well 42. This third heavily doped region 70 may be formed during the ion implantation step used to form the first heavily doped region 50 in the second well 44 since each of the same type. As an important feature, the third heavily doped region 70 is coupled, preferably using a subsequent metal layer, not shown, to the second heavily doped region 52 to form the cathode terminal of the device. In this configuration, the third heavily doped region 70 serves as a well tie for the p-well 42.

Figure 11B:
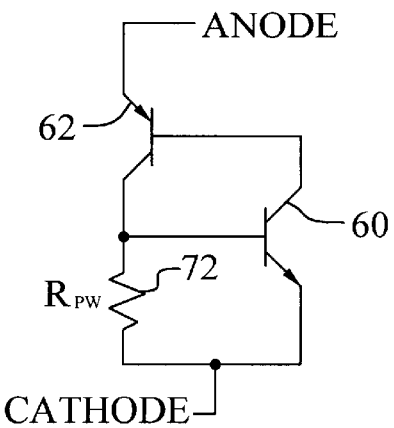

Referring now to FIG. 11B, the resulting SCR model is shown.

The model is similar to that of the prior SCR device. The key difference is that the third heavily doped region 70 creates a well resistance component, $R_{PW}$, 72 for the first well 42. The presence of $R_{PW}$ 72 hastens the turn-ON of the npn device 60 due to current in the p-well 42.

Figure 12A:
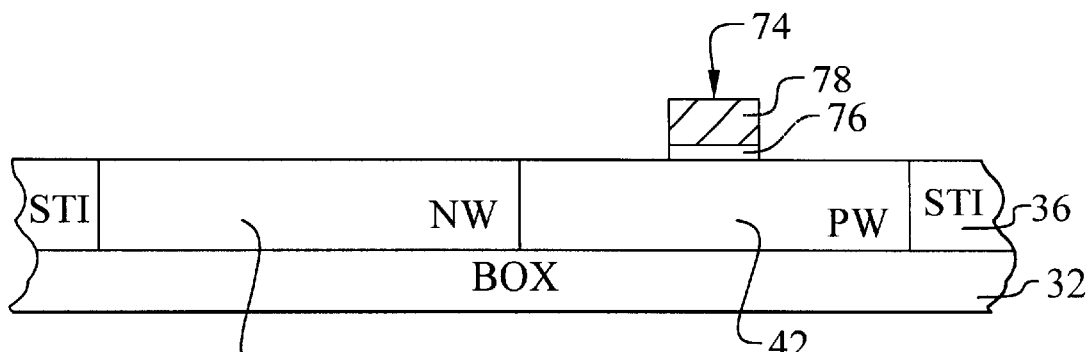
FIGS. 12A, 12B, and 13 illustrate a third preferred embodiment method for forming a gate layer overlying the area between heavily doped regions to thereby replace STI.

Referring now to FIG. 12A, another important feature of the present invention is shown. The absence of the STI regions 36 within the SCR device causes an additional effect. Referring again to FIG. 11A, the second and third heavily doped regions 52 and 70 are formed in the same well 42 and in close proximity. If the same device were formed in the prior art, bulk process, a STI region would separate n+ 52 and p+ 70. The novel method of the present invention removes the STI regions from within the device. Therefore, no STI region separates n+ region 52 and p+ region 70. The absence of the STI region reduces junction leakage. However, this can be further improved by forming a gate isolation region between the second and third heavily doped regions 52 and 70 as will be seen below.

Referring again to FIG. 12A, the gate isolation method is shown. A gate layer 74 is formed overlying the silicon layer in the area between where the second and third heavily doped regions are planned. The gate layer 74 preferably comprises the same gate conductor 78 and gate oxide layer 76 used to form MOS transistors in the integrated circuit process. The gate layer 74 comprises a conductive layer 78 overlying the silicon layer 42 with an insulator layer 76 therebetween. The gate layer 74 is patterned such that it covers the well 42 in the area between the planned heavily doped regions 52 and 70.

Figure 12B:
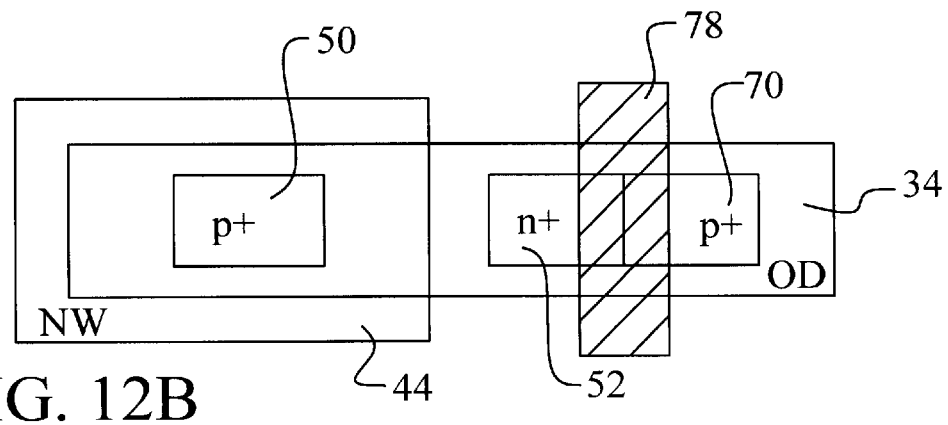
Figure 13:
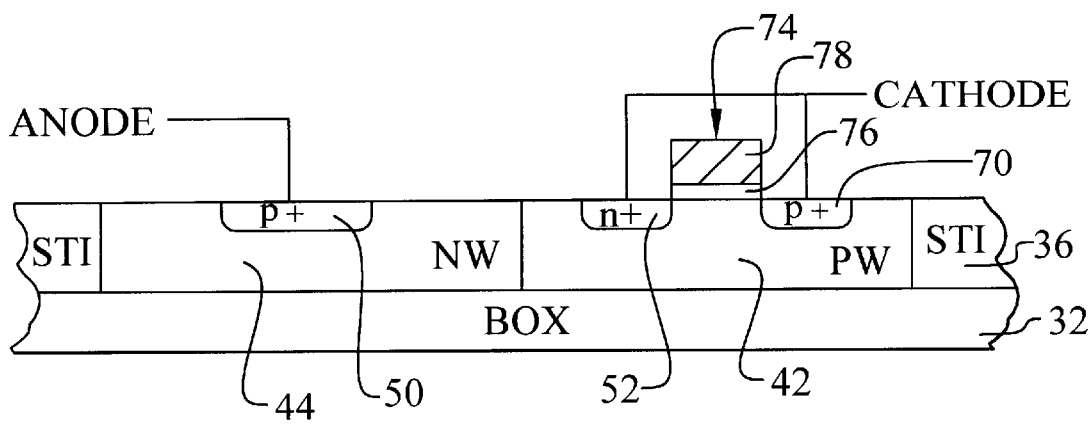

Referring now to FIG. 12B, the layout of the second preferred embodiment SCR device using the gate isolation is shown. The gate conductor, typically polysilicon, mask 78 is defined with the n+ mask 52 and p+ mask 70 overlapping. While the layout presumes a fully depleted process, a partially depleted process layout would also work. The resulting second embodiment SCR device is shown in FIG. 13. Note that the gate layer 74 is left floating. Alternatively, the gate layer 74 may be coupled to the ground reference or to the power supply to optimize the performance of the SCR device. Finally, note that the above-described silicide formation method applies equally to the-SCR device of the second preferred embodiment.

Figure 14A:
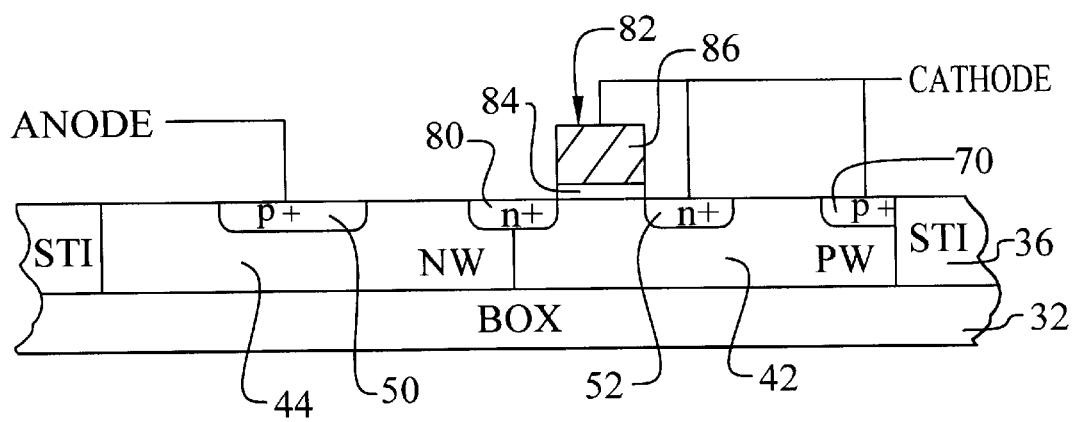
FIGS. 14A–14C illustrate a third preferred embodiment LVT-SCR device of the present invention in cross-section, in top layout view, and in model form.

Referring now to FIG. 14A, a third preferred embodiment SOI SCR device is shown. More particularly, a low voltage triggering SCR, or LVT-SCR device is shown. This device is formed using a similar process as used to form the SOI SCR. The SCR process steps used to form the second embodiment SCR, where the third heavily doped region 70 is added, are again used. Now, a fourth heavily doped region 80, of the second type, is now added. The fourth heavily doped region 80 is formed partially in the first well 42 and partially in the second well 44. More preferably, the fourth heavily doped region 80 comprises a n+ type region that is formed during the formation of the second heavily doped region 52.

A MOS gate 82 is formed overlying the first well 42 in the area between the second and fourth heavily doped regions 52 and 80. The gate 82 comprises a conductive layer 86 overlying the first well 42 with a gate insulator 84 therebetween. Once again, this gate 82 is preferably formed during the MOS gate process for the IC device. The second and fourth heavily doped regions 52 and 70 and the gate 82 are coupled together to form the cathode.

Figure 14B:
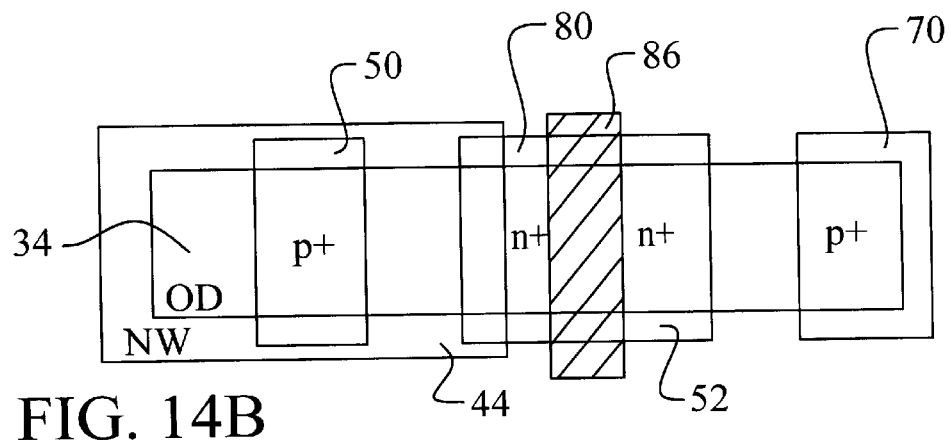
Figure 14C:
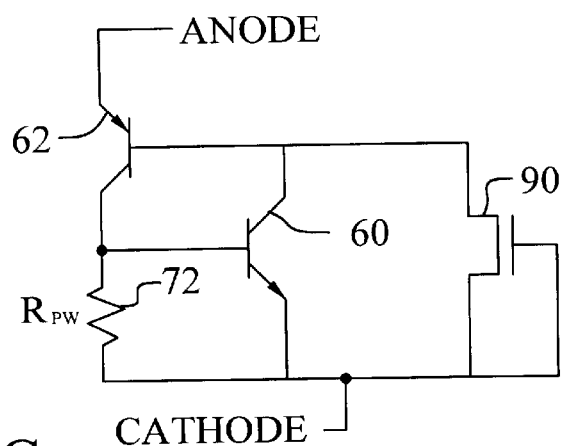

Referring now to FIG. 14C, the addition of the fourth heavily doped region 80 and the gate 82 creates a NMOS transistor 90. The addition of the NMOS transistor 90 creates a LVT-SCR device. The NMOS transistor 90 causes the threshold voltage triggering point for the SCR to be reduced by forward biasing the pnp emitter-base junction at an earlier point.

Referring now to FIG. 14B, the top layout view of the third preferred embodiment, LVT-SCR device is shown. The layout presumes a partially depleted process configuration. A fully depleted configuration would use the undersized p+ and n+ masks 50 and 52 as discussed above. The gate isolation method and the silicide method described above will each work with the third embodiment device.

Figure 15A:
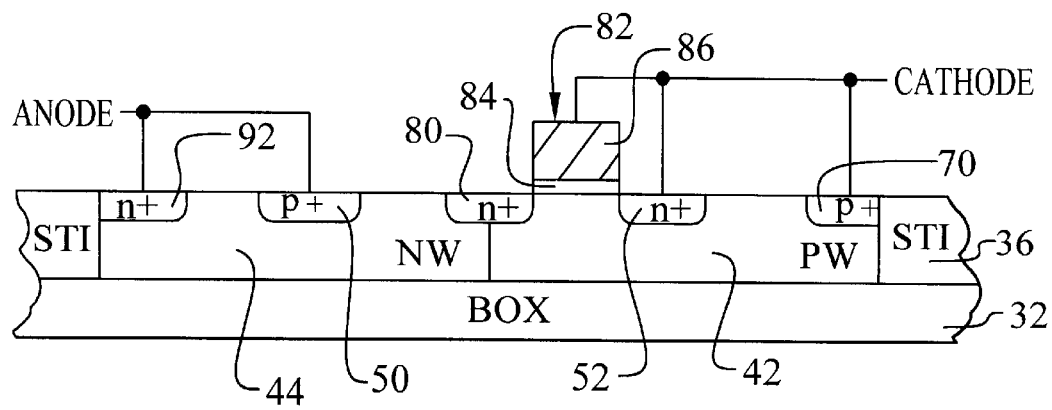
FIGS. 15A–15B illustrate the third preferred embodiment LVT-SCR device of the present invention in cross-section and in model form where the second well is coupled to the anode.
Figure 15B:
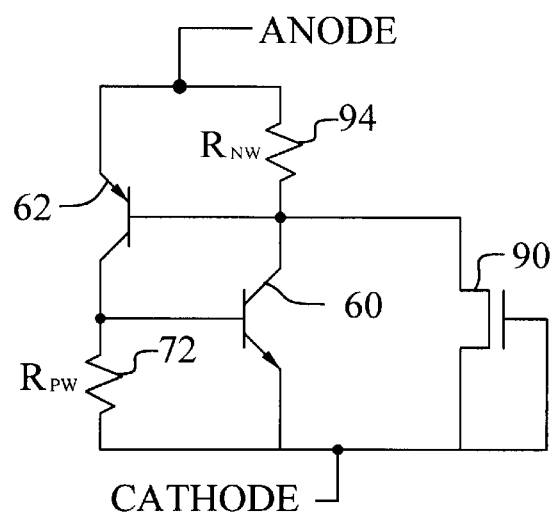

Referring now to FIG. 15A, the third preferred embodiment LVT-SCR device of the present invention is again shown. In this case, the second well 44 is coupled to the anode. A fifth heavily doped region 92 is formed in the second well 44. More particularly, the fifth heavily doped region comprises a n+ type region 92 that is formed during the formation of the second and fourth n+ regions 52 and 80. The addition of this n+ region 92 allows the n-well 44 to be coupled to the anode. Referring now to FIG. 15B, the resulting model is shown. An n-well resistor, $R_{PW}$ 94, is added to the model.

Figure 16A:
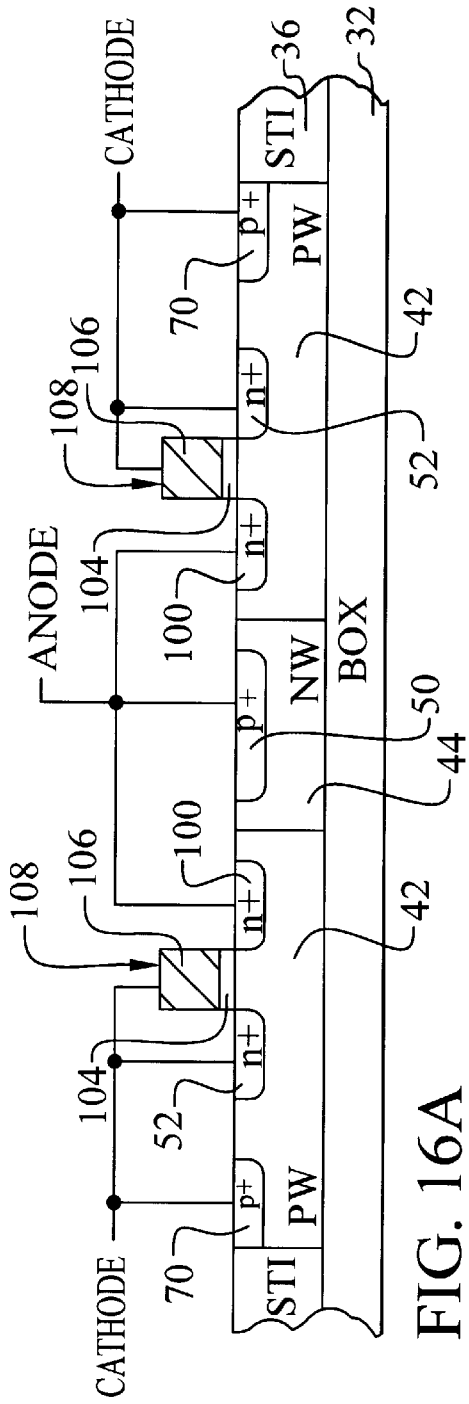
FIGS. 16A–16C illustrate a fourth preferred embodiment LVT-SCR device of the present invention in cross-section and in model form.

Referring now to FIG. 16A, a fourth embodiment SCR device of the present invention is shown. Again, a LVT-SCR device is formed. In this illustration, a symmetric device having an internally placed n-well 44 and externally placed p-wells 42 is shown. However, since the left or right p-well sections 42 are identical and in parallel, the device may be described by either of these sections. This LVT-SCR is similar to the device of the third embodiment. However, as an important change, the fourth heavily doped region 100 is formed completely inside the first well 42. In addition, the coupling of this device is different. While the second and third heavily doped regions 52 and 70 are again coupled together to form the cathode, now the first heavily doped region 50 is coupled to the fourth heavily doped region 100 to form the anode. The resulting device model is shown in FIG. 16C. The NMOS transistor 90 is now coupled from anode to cathode. In addition, the absence of an n-well tie, creates a novel, floating LVT-SCR device having improved performance.

Figure 16B:
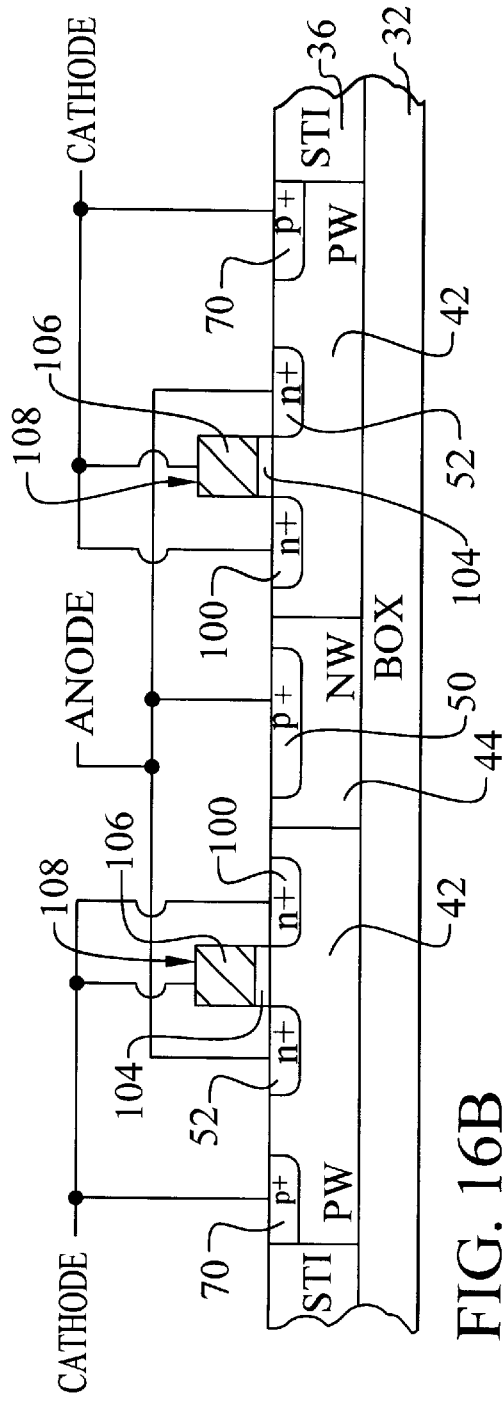
Figure 16C:
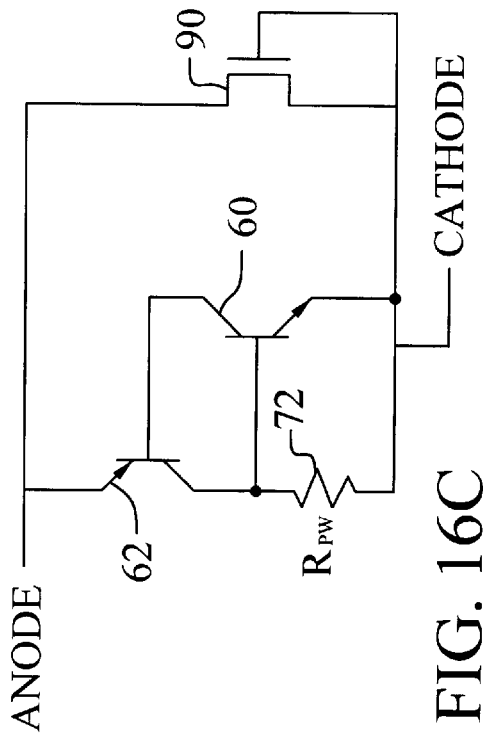
Figure 17A:
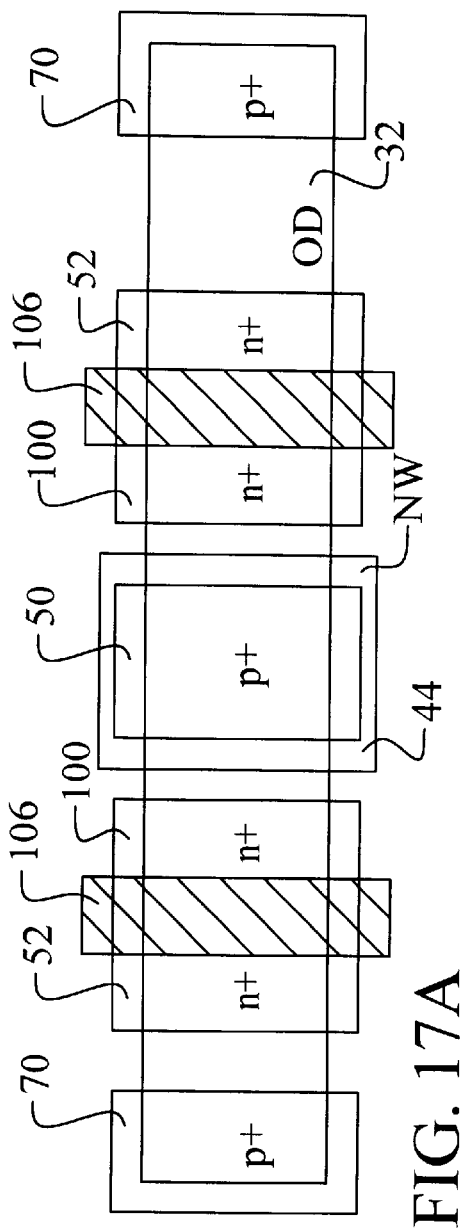
FIGS. 17A–17B illustrate the fourth preferred embodiment LVT-SCR device of the present invention in top layout view for the partially depleted and fully depleted cases.
Figure 17B:
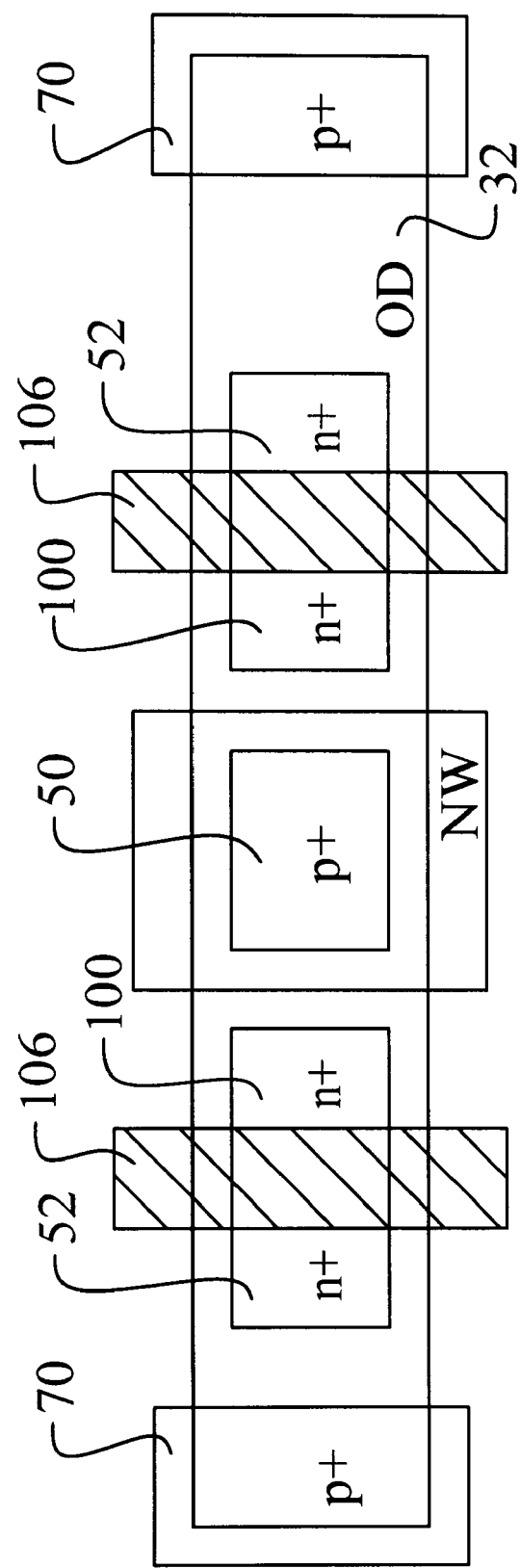

Referring now to FIG. 16B, the connectivity of the second and fourth heavily doped regions 52 and 100 may be switched. Alternatively, this may be described as the second heavily doped region 52 being formed either closer or farther away from the second well 44 than the fourth heavily doped region 100. This placement option will change the performance of the device. Referring now to FIG. 17A a top layout view of the fourth embodiment LVT-SCR is shown. This layout presumes a partially depleted process. Alternatively, FIG. 17B presumes a fully depleted process. The above-described gate isolation method may be used on the fourth embodiment device between, for example, the second and third heavily doped regions. In addition, the above-described silicide method may be used with the fourth embodiment device.

The advantages of the present invention may now be summarized. An effective and very manufacturable method for of forming a SCR ESD device on a SOI substrate is achieved. A SCR device on SOI is formed where the effect of the STI region is reduced. A method to use a gate layer between heavily doped regions instead of a STI is achieved. A method to form self-aligned silicide in the SCR device on SOI is realized. A LVT-SCR device on SOI and a floating-well, LVT-SCR device on SOI are achieved.

As shown in the preferred embodiments, the novel method and device of the present invention provides an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A method to form a SCR device in the manufacture of an integrated circuit device comprising:

providing a SOI substrate comprising a silicon layer overlying a buried oxide layer wherein said silicon layer further comprises a first well of a first type and a second well of a second type;

forming a first heavily doped region of said first type in said second well to form an anode terminal; and forming a second heavily doped region of said second type in said first well to form a cathode terminal;

forming a third heavily doped region of said first type in said first well and coupling said third heavily doped region to said cathode terminal wherein no other heavily doped region lies between said second and third heavily doped regions; and forming a gate overlying said silicon layer and between said second and third heavily doped regions wherein said gate comprises a conductive layer overlying said silicon layer with an insulating layer therebetween to complete said SCR device.

2. The method according to claim 1 further comprising:

forming a masking layer overlying said silicon layer wherein said mask exposes said first and second heavily doped regions while covering said first and second wells;

depositing a metal layer overlying said masking layer and said exposed first and second heavily doped regions;

annealing said metal layer to form a silicide layer in said first and second heavily doped regions; and removing unreacted said metal layer overlying said masking layer and said first, second and third heavily doped regions.

3. The method according to claim 1 wherein said heavily doped regions fully deplete said wells.

4. The method according to claim 1 wherein said heavily doped regions partially deplete said wells.

5. The method according to claim 1 wherein said gate is further coupled to one of the group consisting of: ground reference and power supply.

6. A method to form a LVT-SCR device in the manufacture of an integrated circuit device comprising:

providing a SOI substrate comprising a silicon layer overlying a buried oxide layer wherein said silicon layer further comprises a first well of a first type and a second well of a second type;

forming a first heavily doped region of said first type in said second well to form an anode terminal;

forming a second heavily doped region of said second type in said first well;

forming a third heavily doped region of said first type in said first well wherein said second and third heavily doped regions are spaced apart and wherein no other heavily doped region lies between said second and third heavily doped regions;

forming a fourth heavily doped region of said second type partly in said first well and partly in said second well; and forming a gate overlying said silicon layer between said second and fourth heavily doped regions wherein said gate comprises a conductive layer overlying said silicon layer with an insulator therebetween wherein said second and third heavily doped regions and said gate are coupled together to form a cathode terminal.

7. The method according to claim 6 further comprising:

forming a masking layer overlying said silicon layer wherein said mask exposes said first, second, third, and fourth heavily doped regions while covering said first and second wells;

depositing a metal layer overlying said masking layer and said exposed first, second, third, and fourth heavily doped regions;

annealing said metal layer to form a silicide layer in said first, second, third, and fourth heavily doped regions; and removing unreacted said metal layer overlying said masking layer and said first and second heavily doped regions.

8. The method according to claim 6 wherein said heavily doped regions fully deplete said wells.

9. The method according to claim 6 wherein said heavily doped regions partially deplete said wells.

10. The method according to claim 6 further comprising forming a gate overlying said silicon layer in the area between where said second and third heavily doped regions are planned wherein said gate is formed prior to said steps of forming said second and third heavily doped regions and wherein said gate comprises a conductive layer overlying said silicon layer with an insulating layer therebetween.

11. The method according to claim 10 wherein said gate is further coupled to one of the group consisting of ground reference and power supply.

12. The method according to claim 6 further comprising forming a fifth heavily doped region of said second type in said second well wherein said fifth heavily doped region is coupled to said anode terminal.

13. The method according to claim 12 further comprising forming a gate overlying said silicon layer in the area between where said first and fifth heavily doped regions are planned wherein said gate is formed prior to said steps of forming said first and fifth heavily doped regions and wherein said gate comprises a conductive layer overlying said silicon layer with an insulating layer therebetween.

14. The method according to claim 13 wherein said gate is further coupled to one of the group consisting of: ground reference and power supply.

15. A method to form a LVT-SCR device in the manufacture of an integrated circuit device comprising:

providing a SOI substrate comprising a silicon layer overlying a buried oxide layer wherein said silicon layer further comprises a first well of a first type and a second well of a second type;

forming a first heavily doped region of said first type in said second well;

forming a second heavily doped region of said second type in said first well;

forming a third heavily doped region of said first type in said first well wherein said second and third heavily doped regions are spaced apart and wherein no other heavily doped region lies between said second and third heavily doped regions;

forming a fourth heavily doped region of said second type in said first well; and forming a gate overlying said silicon layer between said second and fourth heavily doped regions wherein said gate comprises a conductive layer overlying said silicon layer with an insulator therebetween, wherein said first and fourth heavily doped regions are coupled together to form an anode terminal and wherein said second and third heavily doped regions and said gate are coupled together to form a cathode terminal.

16. The method according to claim 15 wherein said fourth heavily doped region is closer to said second well than said second heavily doped region.

17. The method according to claim 15 wherein said second heavily doped region is closer to said second well than said fourth heavily doped region.

18. The method according to claim 15 further comprising:

forming a masking layer overlying said silicon layer wherein said mask exposes said first, second, third, and fourth heavily doped regions while covering said first and second wells;

depositing a metal layer overlying said masking layer and said exposed first, second, third, and fourth heavily doped regions;

annealing said metal layer to form a silicide layer in said first, second, third, and fourth heavily doped regions; and removing unreacted said metal layer overlying said masking layer and said first and second heavily doped regions.

19. The method according to claim 15 wherein said heavily doped regions fully deplete said wells.

20. The method according to claim 15 wherein said heavily doped regions partially deplete said wells.

21. The method according to claim 15 further comprising forming a gate overlying said silicon layer in the area between where said second and third heavily doped regions are planned wherein said gate is formed prior to said steps of forming said second and third heavily doped regions and wherein said gate comprises a conductive layer overlying said silicon layer with an insulating layer therebetween.

22. The method according to claim 21 wherein said gate is further coupled to one of the group consisting of: ground reference and power supply.

23. The method according to claim 15 further comprising forming a gate overlying said silicon layer in the area between where said second and fourth heavily doped regions are planned wherein said gate is formed prior to said steps of forming said second and fourth heavily doped regions and wherein said gate comprises a conductive layer overlying said silicon layer with an insulating layer therebetween.

24. The method according to claim 23 wherein said gate is further coupled to one of the group consisting of: ground reference and power supply.

* * * * *